United States Patent [19]
Lee et al.

[11] Patent Number: 6,045,892
[45] Date of Patent: Apr. 4, 2000

[54] METAL WIRING STRUCTURES FOR INTEGRATED CIRCUITS INCLUDING SEED LAYER

[75] Inventors: Ki-hong Lee; Gi-ho Cha, both of Kyungki-do, Rep. of Korea

[73] Assignee: Samsung Electronics Co., Ltd., Rep. of Korea

[21] Appl. No.: 09/016,791

[22] Filed: Jan. 30, 1998

[30] Foreign Application Priority Data

Jul. 23, 1997 [KR] Rep. of Korea ........................ 97-34579

[51] Int. Cl.$^7$ ...................................... B32B 3/00
[52] U.S. Cl. ........................ 428/209; 428/614; 428/620; 428/627; 428/651; 428/901; 257/751; 257/763; 257/765
[58] Field of Search ..................... 428/209, 614, 428/620, 627, 651, 901; 257/751, 763, 765, 767, 771

[56] References Cited

U.S. PATENT DOCUMENTS

| | | | |
|---|---|---|---|
| 5,668,411 | 9/1997 | Hong et al. | 257/751 |
| 5,776,831 | 7/1998 | Padmanabhan et al. | 438/653 |
| 5,869,901 | 2/1999 | Kusuyama | 257/263 |

OTHER PUBLICATIONS

Onoda et al., *"Effects of Insulator Surface Roughness on Al–Alloy Film Properties and Electromigration Performance in Al–Alloy/Ti Insulator Layered Interconnects"*, J.Vac.Sci.Technol. B,14(4),Jul./Aug. 1996, pp. 2645–2655.

Onoda et al., *"Al–Si Crystallographic–Orientation Transition in Al–Si/TiN Layered Structures and Electromigration Performance as Interconnects"*, J. Appl. Phys., 77(2), Jan. 15, 1995, pp. 885–892.

Shibata et al., *"The Effects of Al(111) Crystal Orientation on Electromigration in Half–Micron Layered Al Interconnects"*, Jpn. J. Appl. Phys. vol. 32, 1993, pp. 4479–4484.

Hashimoto et al., *"Bias–Induced Structure Transition in Reactively Sputtered TiN Films"*, Applied Physics Letters, vol. 54, No. 2, 1998, pp. 120–122.

*Primary Examiner*—Timothy Speer
*Assistant Examiner*—Bryant Young
*Attorney, Agent, or Firm*—Myers Bigel Sibley & Sajovec

[57] ABSTRACT

Metal wiring structures for integrated circuits include a seed layer formed on an integrated circuit substrate and a wetting layer formed on the seed layer opposite the integrated circuit substrate. A metal wiring layer is formed on the wetting layer opposite the seed layer. The seed layer and the metal wiring layer have the same crystal orientation. In a preferred embodiment, the seed layer is an aluminum layer having (111) crystal orientation and the metal wiring layer includes aluminum having (111) crystal orientation. The metal wiring layer may be aluminum or an aluminum alloy. The wetting layer preferably includes titanium.

22 Claims, 9 Drawing Sheets

METAL WIRING STRUCTURES FOR INTEGRATED CIRCUITS INCLUDING SEED LAYER

FIELD OF THE INVENTION

This invention relates to integrated circuit devices and fabrication methods, and more particularly to wiring structures for integrated circuits and methods of fabricating same.

BACKGROUND OF THE INVENTION

Integrated circuit devices are widely used in consumer and commercial applications. As the integration density of integrated circuits continues to increase, more active devices such as transistors are integrated in an integrated circuit substrate. These active devices are selectively interconnected using a metal wiring layer on the integrated circuit.

The metal wiring layer may impact the performance and reliability of the integrated circuit device. In particular, the metal wiring layer may be subject to electromigration, thereby degrading the metal wiring layer. It is known that the reliability of the metal wiring layer can be increased by increasing the mean grain size of the metal wiring layer, by reducing deviations in the mean grain size and by growing the metal wiring layer to have a predetermined crystallographic orientation. Finally, the surface morphology of the metal wiring layer can also determine the performance and reliability of the metal wiring layer.

Aluminum is widely used as a metal wiring layer in integrated circuits. In fabricating aluminum wiring layers, it is known that the (111) crystal orientation can provide improved electromigration resistance. See, for example, a publication by Shibata et al. entitled *"The Effects of the Al(111) Crystal Orientation on Electromigration in Half-Micron Layered Al Interconnects"*, Japan Journal of Applied Physics, Vol. 32, 1993, pp. 4479–4484. As disclosed therein, it was found that Al(111) preferred orientation is strongly dependent on the crystal structure and process sequence of the under-metal and universally determined by the difference between the spacing of Al(111) plane and under-metal planes. Moreover, it was found that the electromigration endurance tends to improve in proportion to the degree of Al(111) preferred orientation.

It has also been found that a (111) crystal orientation of an aluminum layer can improve the life span of the layer. See, for example, a publication by Onoda et al., entitled *"Al-Si Crystallographic Orientation Transition in Al-Si/TiN Layered Structures and Electromigration Performance as Interconnects"*, Journal of Applied Physics, Vol. 77, No.2, Jan. 15, 1995, pp. 885–892. As disclosed therein, the electromigration lifetime is longer in Al metal lines having a large grain size, a small grain size standard deviation and a strong (111) orientation.

Finally, it is also known that insulator surface roughness can effect the electromigration properties and surface morphology of an aluminum alloy layer. See, for example, an article by Onoda et al. entitled *"Effects of Insulator Surface Roughness of Al-Alloy Film Properties and Electromigration Performance in Al-Alloy/Ti Insulator Layered Interconnects"*, J. Vac. Sci. Technol. B, Vol. 14, No. 4, Jul./Aug. 1996, pp. 2645–2655. Similar effects may be found for metal wiring structures other than aluminum. See, for example, a publication by Hashimoto et al. entitled *"Bias-Induced Structure Transition in Reactively Sputtered TiN Filrs"*, Applied Physics Letters, Vol. 54, No. 2, 1989, pp. 120–122. This publication discloses that a crystallographic structure transition in TiN films may be observed with an increase in negative substrate bias and reactive sputtering. The crystal orientation normal to the film surface changed from (111) to (200) direction.

Unfortunately, it may be difficult to form a metal wiring structure having a preferred crystal orientation. More specifically, a metal wiring structure may include an underlying wetting layer, such as titanium or titanium nitride. Since the wetting layer may have multiple crystal orientations, it may be difficult to form a metal wiring layer thereon with a preferred crystal orientation. Therefore, the electromigration resistance, reliability and surface morphology of the metal wiring layer may be degraded.

SUMMARY OF THE INVENTION

It is therefore an object of the present invention to provide improved metal wiring structures for integrated circuits and fabrication methods therefor.

It is another object of the present invention to provide metal wiring structures that can have a preferred crystal orientation and methods of fabricating the same.

These and other objects are provided, according to the present invention, by providing a seed layer beneath a wetting layer, so that a metal wiring layer formed on the wetting layer opposite the seed layer has the same crystal orientation as the seed layer. The metal wiring layer can maintain the same crystal orientation as the seed layer, notwithstanding the intervening wetting layer therebetween.

In particular, metal wiring structures for integrated circuits according to the invention include a seed layer on an integrated circuit substrate and a wetting layer on the seed layer opposite the integrated circuit substrate. A metal wiring layer is included on the wetting layer opposite the seed layer. The seed layer and the metal wiring layer have same crystal orientation. In a preferred embodiment, the seed layer is an aluminum layer having (111) crystal orientation and the metal wiring layer comprises aluminum having (111) crystal orientation. The metal wiring layer may be aluminum or an aluminum alloy. The wetting layer preferably comprises titanium, and more preferably is selected from the group consisting of a titanium layer, a titanium nitride layer and a composite layer of titanium and titanium nitride.

The integrated circuit may include an insulating layer thereon having a contact hole therein, and the seed layer may be on the insulating layer including in the contact hole. In one embodiment, the contact hole exposes an underlying portion of the integrated circuit substrate and the seed layer is on the insulating layer, including on the underlying portion of the integrated circuit substrate in the contact hole. A barrier layer may also be included between the underlying portion of the integrated circuit substrate and the seed layer in the contact hole. In another embodiment, a conductive layer may be included between the insulating layer and the integrated circuit substrate, so that the contact hole exposes an underlying portion of the conductive layer, and the seed layer is on the insulating layer including on the underlying portion of the conductive layer in the contact hole.

Metal wiring structures for integrated circuits may be fabricated, according to the invention, by forming a seed layer on an integrated circuit and forming a wetting layer on the seed layer opposite the integrated circuit substrate. A metal wiring layer is formed on the wetting layer opposite the seed layer, such that the metal wiring layer has same crystal orientation as the seed layer. The seed layer is preferably an aluminum layer having (111) crystal orientation, and the metal wiring layer preferably comprises aluminum having (111) crystal orientation. The wetting layer preferably comprises titanium alloys.

The step of forming a seed layer may be preceded by the step of forming an insulating layer having a contact hole therein on the integrated circuit substrate. In this case, the step of forming a seed layer comprises the step of forming a seed layer on the insulating layer including in the contact hole. The contact hole may expose an underlying portion of the integrated circuit substrate, or may expose a conductive layer on the integrated circuit substrate. A conductive plug may be formed in the contact hole prior to forming a seed layer. Preferably, the steps of forming a seed layer, forming a wetting layer and forming a metal wiring layer are all performed in situ without a vacuum break.

Accordingly, a preferred orientation of the metal wiring layer may be obtained due to the orientation of the seed layer, notwithstanding the wetting layer between the seed layer and the metal wiring layer. Improved metal wiring structures and fabrication methods may thereby be provided.

DETAILED DESCRIPTION OF THE PREFERRED EMBODIMENTS

Figure 1:
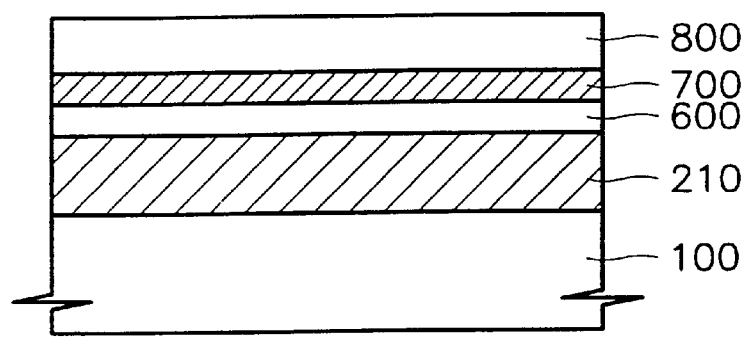
FIG. 1 is a sectional view illustrating a metal wiring structure according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

FIG. 1 illustrates a metal wiring structure of the present invention. A metal wiring structure of the present invention includes a seed (first) layer 600 formed on an insulating layer 210 over an integrated circuit substrate, such as a semiconductor substrate 100, a wetting (second) layer 700 and a metal wiring (third) layer 800 on the seed layer 600. Here, the seed layer 600 is an aluminum layer, and the wetting layer 700 is a titanium layer, a titanium nitride layer, or a composite layer thereof. The metal wiring layer 800 is an aluminum layer or an aluminum alloy layer such as an aluminum-copper alloy layer, an aluminum-silicon alloy layer, or an aluminum-copper-silicon alloy layer.

The insulating layer 210 may have a contact hole (shown below) to enable the seed layer 600, the wetting layer 700, and the metal wiring layer 800 to make electrical contact with the semiconductor substrate 100. According to the present invention, the metal wiring layer 800 has a constant crystal orientation due to the seed layer 600. Since the aluminum layer used as the seed layer 600 has a (111) crystal orientation, the wetting layer 700 on the seed layer 600 grows into a specific orientation having a lattice parameter approximate to the lattice parameter of the (111) oriented aluminum layer. As a result, the metal wiring layer 800 on the wetting layer 700 grows into the same crystal orientation, that is, the (111) crystal orientation, having the same lattice parameter as that of the (111) oriented aluminum layer.

Since the metal wiring layer 800 is highly oriented in the (111) crystal orientation rather than the (200) crystal orientation, the migration of metal atoms caused by electron collision may be reduced. Thus, the electromigration properties of the metal wiring layer 800 can be improved.

FIGS. 2–6 are sectional views illustrating a metal wiring fabricating method according to a first embodiment of the present invention.

Figure 2:
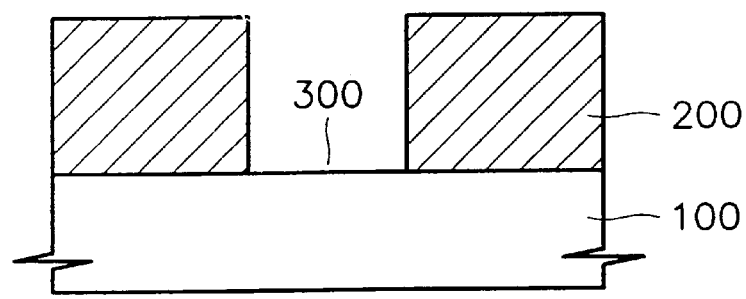
FIGS. 2–6 are sectional views illustrating a metal wiring structure fabricating method according to a first embodiment of the present invention.

FIG. 2 illustrates the step of forming an insulating layer pattern 200 on a semiconductor substrate 100. An insulating layer is formed of an Undoped Silicate Glass (USG) layer, a Spin-On-Glass (SOG) layer, a BoroPhosphoSilicate Glass (BPSG) layer, or a composite layer thereof, on the semiconductor substrate 100 doped with impurities. Then, the insulating layer pattern 200 is formed including a contact hole 300 for exposing a predetermined underlying portion of the semiconductor substrate 100, by patterning the insulating layer.

Figure 3:
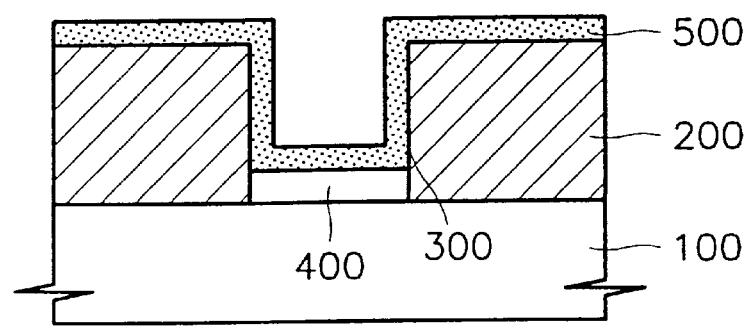

FIG. 3 illustrates the step of forming an ohmic layer 400 and a barrier metal layer 500 on the semiconductor substrate 100. The surfaces of the semiconductor substrate 100 exposed by the contact hole 300 and the insulating layer pattern 200 are cleaned using an Electron Cyclotron Resonance (ECR) etch. Then, the ohmic layer 400 is formed to contact the semiconductor substrate 100 exposed by the contact hole 300. The ohmic layer 400 makes an ohmic contact between a metal layer to be formed later and the semiconductor substrate 100. The ohmic layer 400 may be formed by depositing a titanium (Ti) layer to a thickness of about 300Å. The titanium layer can form a titanium silicide layer after heat treatment. By this titanium silicide layer, the semiconductor substrate 100 makes ohmic-contact with the metal layer to be formed later.

Subsequently, the barrier metal layer 500 is formed on the ohmic layer 400 to prevent diffusion of material used for the metal layer to be formed later. For example, a titanium nitride (TiN) layer is used as the barrier metal layer 500. Here, the titanium nitride layer is formed to a thickness of about 500Å.

The ECR etch, ohmic layer forming, and barrier metal layer forming steps are preferably performed in situ without a vacuum break. The ohmic layer 400 and the barrier metal layer 500 are thermally treated and annealed, for example, at about 480° C. in a nitrogen ($N_2$) gas atmosphere.

Figure 4:
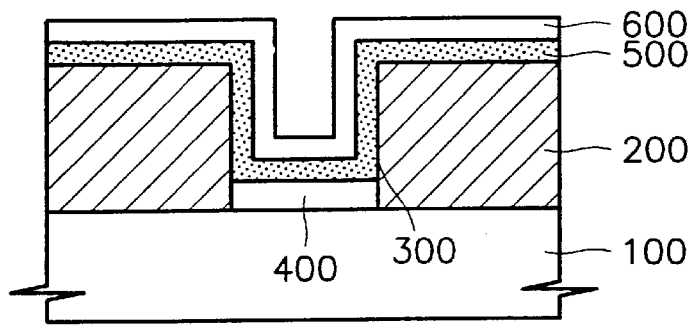

FIG. 4 illustrates the step of forming a seed layer 600 on the barrier metal layer 500. The semiconductor substrate 100 having the barrier metal layer 500 formed thereon is degassed, for example, in situ without a vacuum break with the barrier metal layer forming step, at about 500° C. Then, the seed layer 600 is formed by depositing a metal layer, for example, an aluminum layer to a thickness of about 50–1000Å, preferably about 300Å, on the barrier metal layer 500. The aluminum layer may be formed at about 10–650° C., preferably, at room temperature in a vacuum of about $5\times10^{-8}$ Torr or below. The aluminum seed layer 600 has a (111) crystal orientation.

Figure 5:
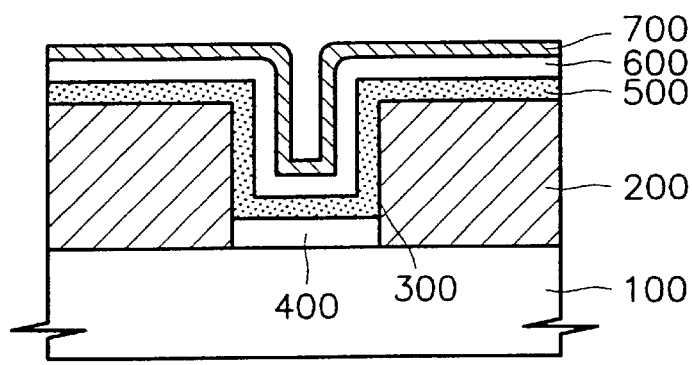

FIG. 5 illustrates the step of forming a wetting layer 700 on the seed layer 600. The wetting layer 700 is formed by depositing a titanium layer, a titanium nitride layer, or a composite layer thereof on the seed layer 600. The titanium layer, deposited to a thickness of about 300Å on the seed layer 600 in situ without a vacuum break with the seed layer forming step, is preferably used as the wetting layer 700. The wetting layer 700 increases the wettability of the metal layer to be formed on the wetting layer 700.

The crystal properties of the wetting layer 700 are influenced by the crystal structure of the seed layer 600. The seed layer 600 has a (111) preferred crystal orientation and a lattice parameter of 2.338Å in the (111) crystal direction. Further, the lattice parameter of the (111) oriented titanium nitride layer used as the wetting layer 700 is 2.44Å, approximate to that of the seed layer 600. When the titanium nitride layer is formed on the aluminum layer as the wetting layer 700, after forming the aluminum layer as the seed layer 600, the titanium nitride layer grows into a specific crystal orientation having a lattice parameter close to 2.338Å of (111) oriented aluminum layer. Thus, the resulting structure of the titanium nitride layer has a (111) preferred crystal orientation.

The same effects may be achieved by forming a titanium layer as the wetting layer 700. If a titanium wetting layer is formed on the aluminum seed layer, the titanium layer grows into a specific crystal orientation which has a lattice parameter close to 2.338Å of (111) oriented aluminum layer. In fact, the (200) oriented titanium layer has a lattice parameter of 2.342Å approximate to the (111) oriented aluminum seed layer. Therefore, the titanium layer is grown to have a (200) preferred crystal orientation and a crystal structure of a lattice parameter 2.342Å.

Figure 6:
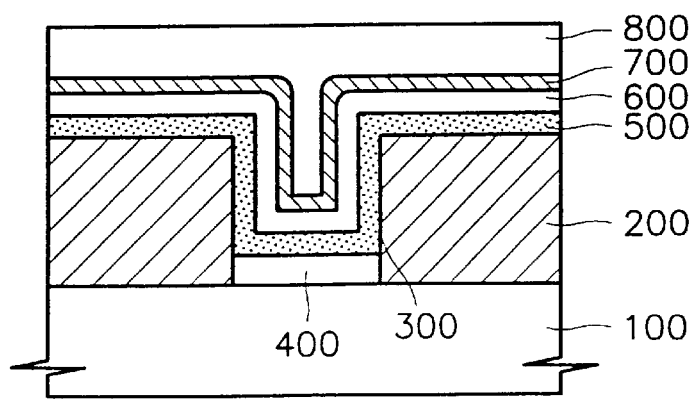

FIG. 6 illustrates the step of forming a metal wiring layer 800 on the wetting layer 700. The metal wiring layer 800 is formed by depositing a metal layer such as an aluminum layer or an aluminum alloy layer on the wetting layer 700. Here, the aluminum layer is formed by sputtering or Chemical Vapor Deposition (CVD). For example, the aluminum layer is formed at about 400–650° C. in situ by sputtering without a vacuum break with the seed and wetting layer forming steps. Preferably, the metal wiring layer 800 is formed by depositing the aluminum layer to a thickness of about 5000Å at about 550° C. by sputtering.

The crystal structure of the metal wiring layer 800 is influenced by that of the underlying wetting layer 700. As described referring to FIG. 5, the titanium nitride layer used as the wetting layer 700 has the (111) preferred crystal orientation, that is, the crystal structure of a lattice parameter 2.44Å. Therefore, the aluminum wiring layer 800 on the wetting layer 700 is grown preferentially in a crystal direction of a lattice parameter approximate to 2.44Å. Therefore, the aluminum layer is grown to have the (111) preferred crystal orientation of a lattice parameter 2.338Å. Accordingly, the aluminum wiring layer 800 in the present embodiment has the (111) preferred crystal orientation due to the crystal structure of its underlayers, that is, the seed layer 600 and the wetting layer 700. Thus, the aluminum layer generally has phases in the (111) crystal direction. The electromigration properties of the metal wiring layer 800 thus may be improved since it is highly oriented toward the (111) crystal direction.

When the titanium layer is used as the wetting layer 700, the titanium layer is grown in a crystal direction having a lattice parameter approximate to the lattice parameter of the (111) oriented aluminum layer used as the seed layer 600, as described referring to FIG. 5. That is, the titanium layer is grown to have a (200) preferred crystal orientation with a lattice parameter 2.342Å. Therefore, the aluminum layer, formed on the titanium layer having the preferred (200) crystal orientation of a lattice parameter 2.342Å, is grown preferentially in the crystal direction of a lattice parameter approximate to that of the titanium layer, that is, 2.342Å. Thus, the aluminum layer is preferentially grown to have the (111) crystal orientation of a lattice parameter 2.338Å approximate to 2.342Å.

As described above, due to the seed layer 600, the titanium layer or the titanium nitride layer used as the wetting layer 700 is grown to have a preferred crystal orientation of a lattice parameter approximate to that of the seed layer 600. That is, the titanium nitride layer is grown in the (111) crystal direction, while the titanium layer is grown in a (200) crystal direction. Therefore, the aluminum layer 800 formed on the wetting layer 700 is uniformly formed to have the (111) crystal orientation of a lattice parameter approximate to that of its underlying layer. Thus, the surface morphology as well as the electromigration properties of the aluminum layer can be improved.

Figure 7:
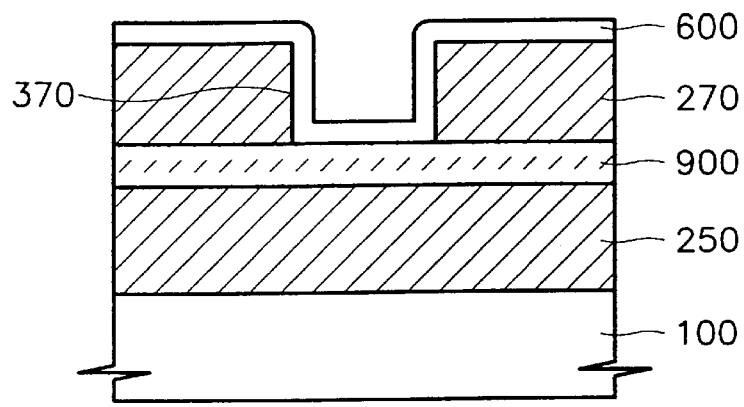
FIGS. 7 and 8 are sectional views illustrating a metal wiring structure fabricating method according to a second embodiment of the present invention.
Figure 8:
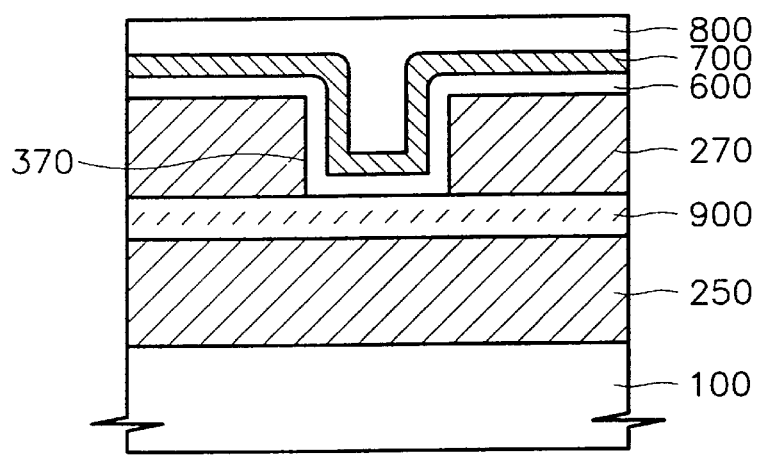

FIGS. 7 and 8 are sectional views illustrating a metal wiring structure fabricating method according to a second embodiment of the present invention.

While the first embodiment deals with formation of a metal wiring structure contacting the semiconductor substrate 100, the second embodiment deals with formation of a metal wiring structure in a multilayered wiring structure. Like reference numerals denote the same components as those in the first embodiment.

FIG. 7 illustrates the step of forming the seed layer 600 on a conductive layer 900. The first insulating layer pattern 250 is formed on the semiconductor substrate 100 to have a first contact hole for exposing a predetermined portion of the semiconductor substrate 100 as in the method for forming the insulating layer 200 in FIG. 2. Then, the conductive layer 900 is formed by depositing a metal layer, for example, a copper layer, a tungsten layer, or an aluminum layer on the first insulating layer pattern 250 to be connected to the semiconductor substrate 100 via the first contact hole. An aluminum layer is preferably used as the conductive layer 900. Here, the aluminum layer may be formed by CVD, but is preferably formed at about 550° C. by sputtering.

Subsequently, a second insulating layer pattern 270 is formed on the conductive layer 900 to expose a predetermined underlying portion of the conductive layer 900 as in the method for forming the insulating layer pattern 200 in FIG. 2. Then, the seed layer 600 is formed to contact the conductive layer 900 as in the method described referring to FIG. 4. For example, the seed layer 600 is formed by depositing an aluminum layer at room temperature at a near vacuum pressure of about $5 \times 10^{-8}$ Torr or below. This aluminum layer has a strong degree of (111) preferred crystal orientation. Here, the ohmic layer 400 and barrier metal layer 500 forming steps of the first embodiment can be omitted.

FIG. 8 illustrates the step of forming the wetting layer 700 and the metal wiring layer 800 on the seed layer 600. As described referring to FIG. 5, the wetting layer 700 is formed by depositing a titanium layer, a titanium nitride layer, or a composite layer thereof on the seed layer 600. Then, the metal wiring layer 800 is formed by depositing an aluminum layer on the wetting layer 700 as in the method described referring to FIG. 6.

Figure 9:
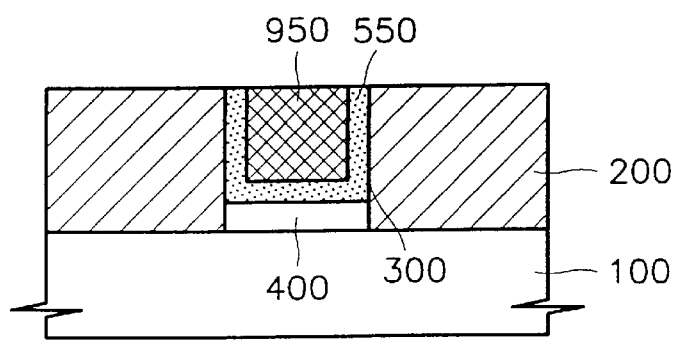
FIGS. 9 and 10 are sectional views illustrating a metal wiring structure fabricating method according to a third embodiment of the present invention.
Figure 10:
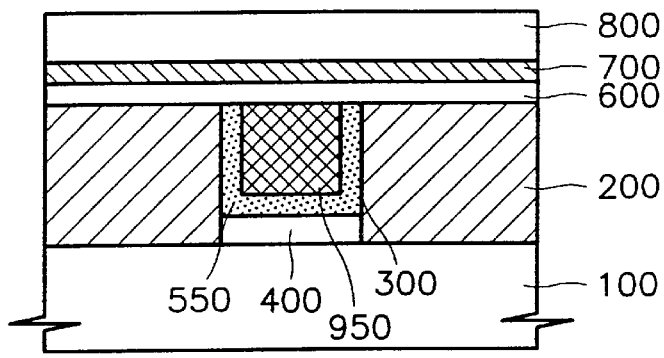

FIGS. 9 and 10 are sectional views illustrating a metal wiring fabricating method according to a third embodiment of the present invention. Like reference numerals denote the same components as those in the first and second embodiments. Compared to the first embodiment, the contact hole 300 of the insulating layer pattern 200 is not filled with the metal wiring layer 800. Rather, a plug is formed in the contact hole 300 to contact the semiconductor substrate 100 before forming the metal wiring layer 800. Compared to the second embodiment, the metal wiring layer 800 in the third embodiment is not connected to the conductive layer 900 but is rather connected to the semiconductor substrate 100.

FIG. 9 illustrates the step of forming a plug 950 connected to the semiconductor substrate 100. As described referring to FIG. 2, the insulating layer pattern 200 is formed on the impurity-doped semiconductor substrate 100 to have a contact hole 300 for exposing a predetermined portion of the semiconductor substrate 100. Then, the ohmic layer 400 is formed on the exposed semiconductor substrate 100 as in the method described referring to FIG. 3. The barrier metal layer forming step of the first embodiment can be omitted.

Then, a glue layer 550 is formed on the ohmic layer 400. A titanium nitride layer may be used as the glue layer 550. This glue layer 550 improves contact characteristics of the interface between a plug to be formed later and the semiconductor substrate 100 or between the plug and the insulating layer pattern 200, thus reducing or preventing failure of the plug such as lifting. After formation of the glue layer 550, a conductive material, for example, tungsten, is deposited on the glue layer 550, thus forming a tungsten layer in contact with the glue layer 550. Then, the plug 950 is formed in the contact hole 300 by patterning the tungsten layer.

FIG. 10 illustrates the step of forming the seed layer 600, the wetting layer 700, and the metal wiring layer 800 on the structure having the plug 950 formed therein.

The seed layer 600 is formed on the structure having the plug 950 formed therein as in the method described referring to FIG. 4. For example, an aluminum layer is used as the seed layer 600. Then, the wetting layer 700 is formed on the seed layer 600 as in the method described referring to FIG. 5. Here, the wetting layer 700 is a titanium layer, a titanium nitride layer, or a composite layer thereof formed in situ without a vacuum break with the seed layer forming step. Subsequently, the metal wiring layer 800 is formed on the wetting layer 600 as in the method described referring to FIG. 6. For example, an aluminum or an aluminum alloy layer is formed as the metal wiring layer 800 in situ without a vacuum break with the wetting layer forming step, by sputtering or CVD.

Figure 11:
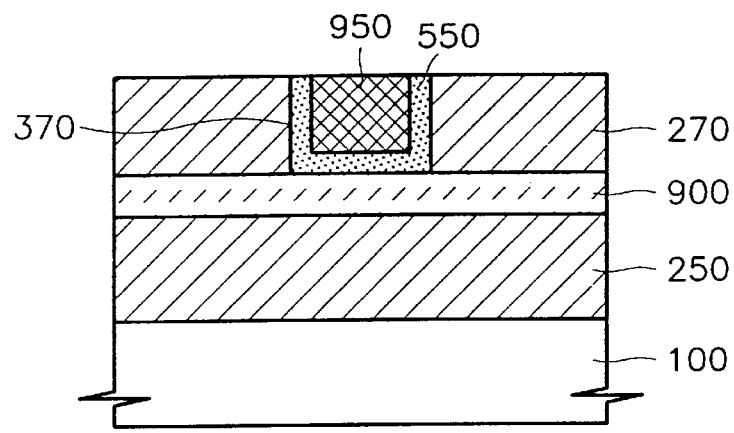
FIGS. 11 and 12 are sectional views illustrating a metal wiring structure fabricating method according to a fourth embodiment of the present invention.
Figure 12:
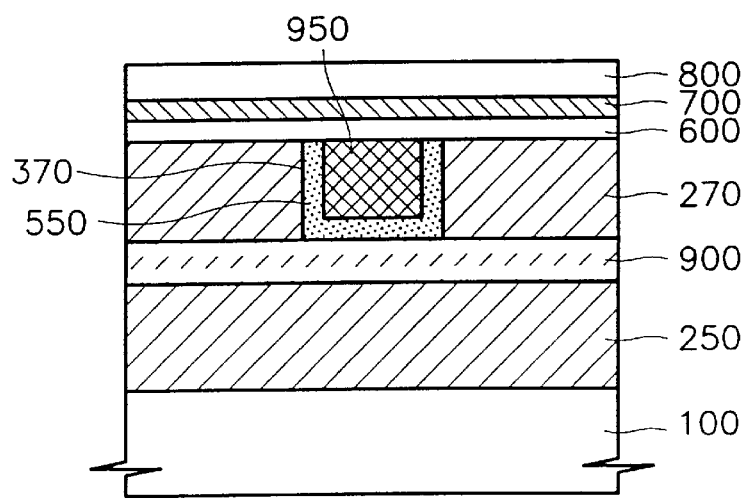

FIGS. 11 and 12 are sectional views illustrating a metal wiring fabricating method according to a fourth embodiment of the present invention. Like reference numerals denote the same components as those in the first through third embodiments. The fourth embodiment is different from the second embodiment in that the plug 950 is introduced, and different from the third embodiment in that a multilayered wiring structure is formed.

FIG. 11 illustrates the step of forming the plug 950 on the conductive layer 900. The first insulating layer pattern 250 is formed, on the semiconductor substrate 100, to have a first contact hole for exposing the semiconductor substrate 100, as in the method described referring to FIGS. 2 and 7. Then, the conductive layer 900, for example, an aluminum layer to be connected to the semiconductor substrate 100, is formed on the first insulating layer pattern 250 as in the method described referring to FIG. 7. Then, the second insulating layer pattern 270 is formed on the conductive layer 900 to have a second contact hole 370 for exposing a predetermined portion of the conductive layer 900.

Subsequently, as in the method described referring to FIG. 9, the glue layer 550 is formed on the exposed conductive layer 900 by depositing a titanium layer, a titanium nitride layer, or a composite layer thereof. Here, the step of forming the ohmic layer 400 as an underlayer of the glue layer 550 can be omitted, in contrast to the third embodiment. Then, the plug 950 is formed in the second contact hole 370 by forming a tungsten layer to contact the glue layer 550 and patterning the tungsten layer, as in the method described referring to FIG. 9.

FIG. 12 illustrates the step of forming the seed layer 600, the wetting layer 700, and the metal wiring layer 800 on the overall surface of the resultant structure having the plug 950 formed therein.

As in the method described with reference to FIG. 10, the seed layer 600 is formed of, for example, an aluminum layer, on the overall surface of the resultant structure having the plug 950 formed therein. Then, the wetting layer 700 is formed by depositing a titanium layer, a titanium nitride layer, or a composite layer thereof on the seed layer 600 in situ without a vacuum break with the seed layer forming step. Subsequently, the metal wiring layer 800 is formed by depositing a metal layer, for example, an aluminum layer on the wetting layer 700 in situ without a vacuum break with the wetting layer forming step.

The present invention will now be described referring to specific examples. These examples should not be construed as limiting.

Example 1: X-ray Diffraction Pattern of Wetting Layer

Figure 13:
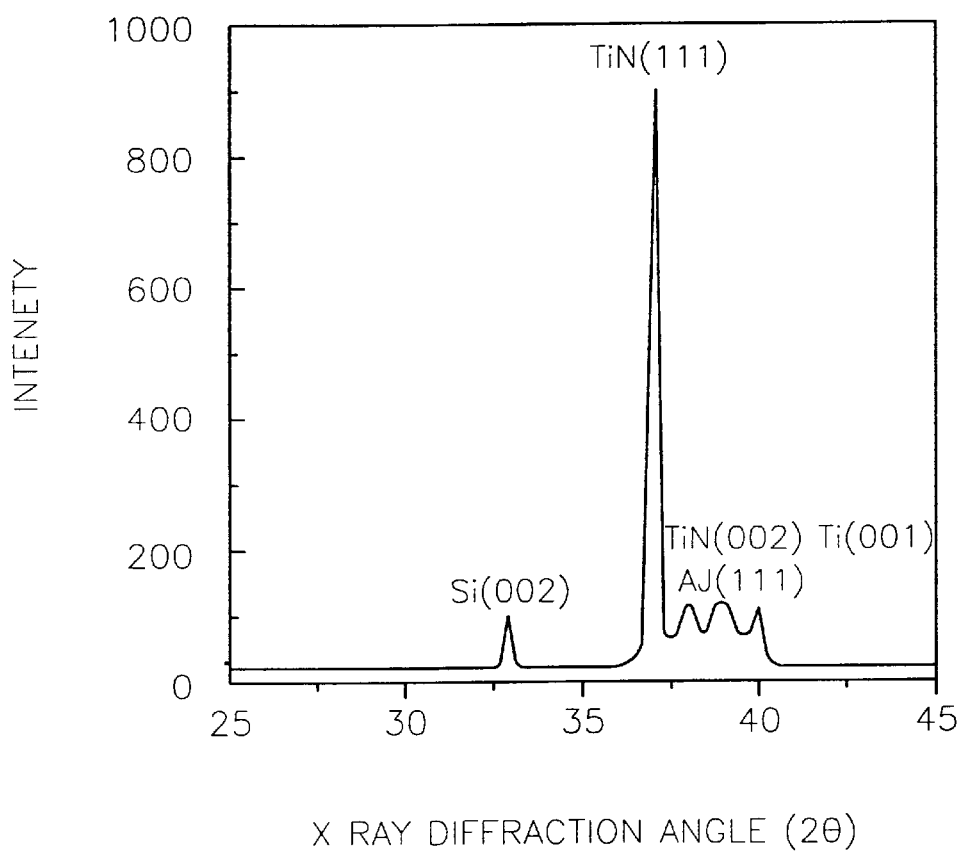
FIG. 13 is a graph showing an X-ray diffraction pattern observed in a wetting layer with a seed layer.

A sample was prepared under the following conditions in order to evaluate the crystal properties of a wetting layer of the present invention with an X-ray diffractometer. An HTO layer, a USG layer, or a BPSG layer was used as an insulating layer on a silicon substrate. Then, a titanium layer and a titanium nitride layer were deposited and thermally treated in a nitrogen ($N_2$) gas atmosphere. After forming an aluminum layer as a seed layer on the titanium nitride layer, a titanium nitride layer was formed as the wetting layer to a thickness of about 1000Å on the seed layer. Though the wetting layer is generally about 300Å thick in actual fabrication of a semiconductor device, the titanium nitride layer was formed to be 1000Å thick in order to clarify test results. An X-ray diffraction pattern was observed on this sample and the results are shown in FIG. 13. Referring to FIG. 13, X-ray diffraction angles (2θ) are set on an X-axis in a range between 25–45°, and the intensity of measured diffraction peaks are set on a Y-axis.

In addition, in order to evaluate the crystal properties of a wetting layer of the present invention by comparison, a sample was prepared according to a conventional metal wiring fabricating method. The sample in the conventional technology is the same as that of the present invention except that the seed layer was not introduced. Then, an X ray diffraction pattern was observed on the wetting layer in the same manner as that for the sample of the present invention and shown in FIG. 14.

Figure 14:
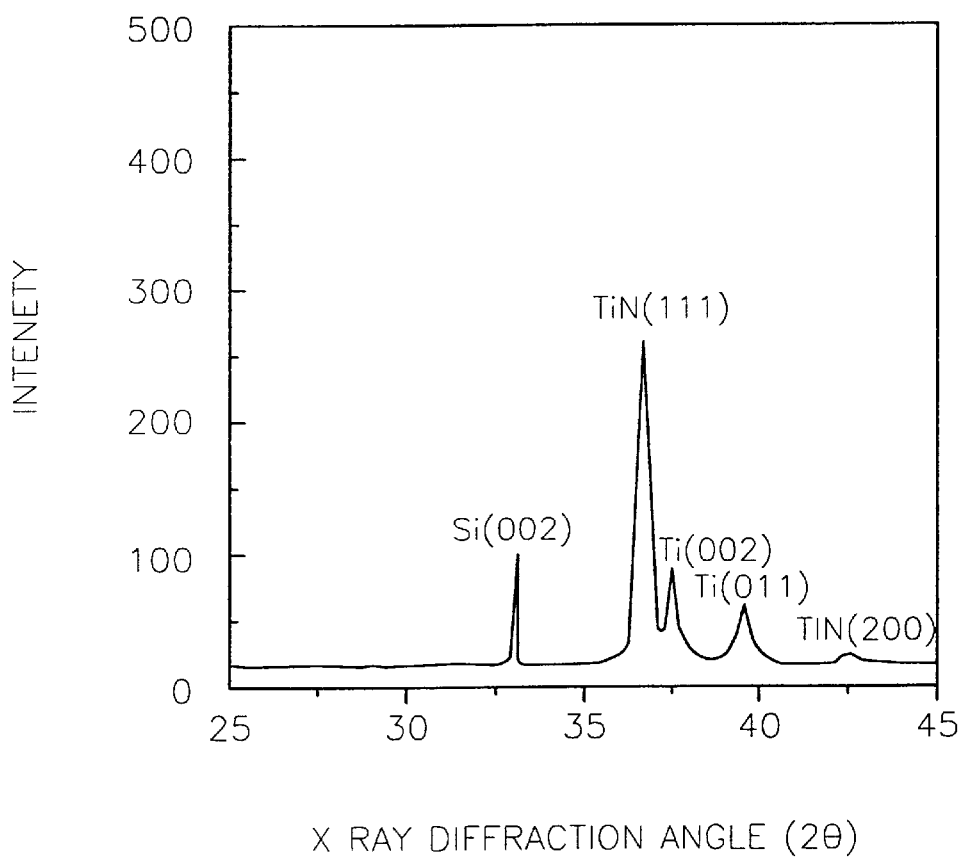
FIG. 14 is a graph showing an X-ray diffraction pattern observed in a wetting layer without the seed layer.

In comparing the intensities of peaks showing the (111) crystal orientation of the titanium nitride layers shown in FIGS. 13 and 14, the former is about three times higher than the latter. Therefore, it is noted that introduction of the seed layer increases the (111) crystal orientation of the titanium nitride. Further, the (200) peak of the titanium nitride shown in FIG. 14 is absent in FIG. 13. Therefore, it can be inferred that the titanium nitride layer is grown to have a (111) preferred crystal orientation due to the seed layer.

Since the lattice parameters of the (111) oriented aluminum layer and the (111) oriented titanium nitride layer are 2.338Å and 2.44Å, respectively, it is shown that the aluminum seed layer enables the titanium nitride wetting layer to grow in a predetermined direction of a lattice parameter approximate to that of the seed layer, that is, to have the (111) crystal orientation.

Example 2: X-ray Diffraction Pattern of Metal Wiring Layer

Figure 15:
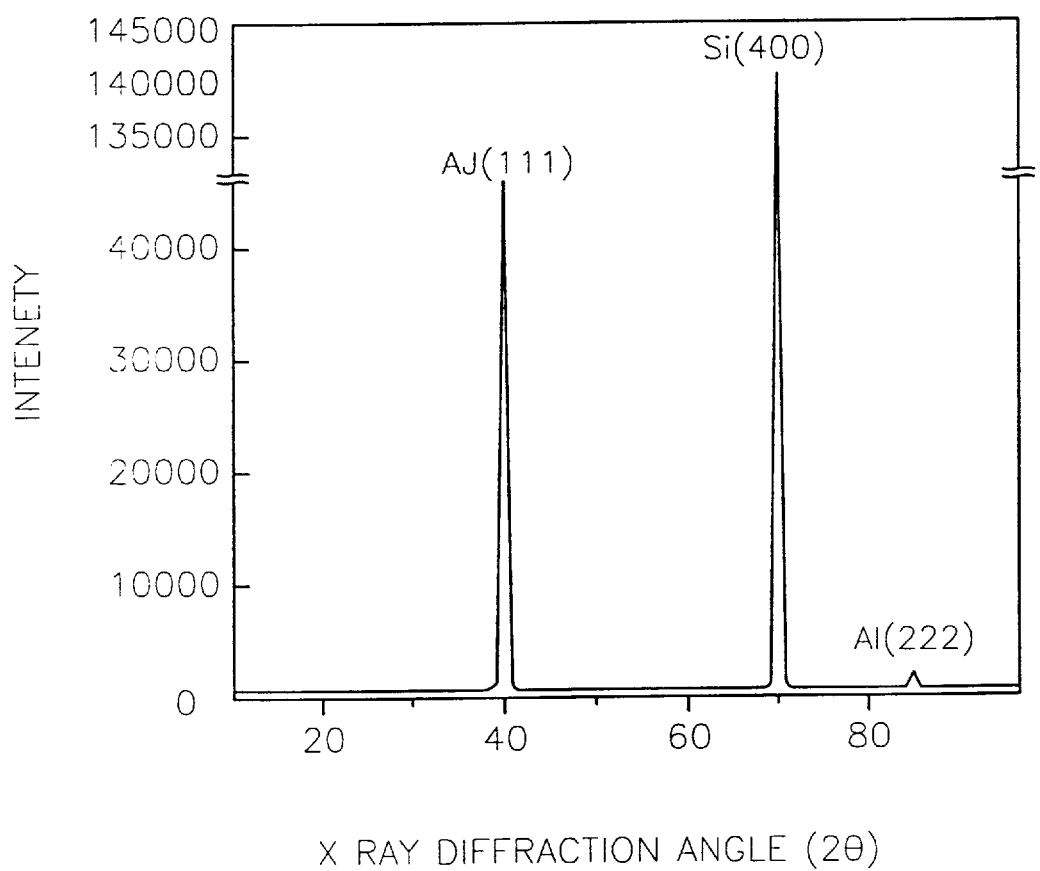
FIG. 15 is a graph showing an X-ray diffraction pattern observed in a metal wiring layer with the seed layer.

A sample was prepared under the following conditions in order to evaluate the properties of a metal wiring layer of the present invention. An HTO layer, a USG layer, or a BPSG layer was used as an insulating layer on a silicon substrate. Then, a titanium layer and titanium nitride layer were deposited and thermally treated in a nitrogen ($N_2$) gas atmosphere. After forming an aluminum layer as a seed layer on the titanium nitride layer, a titanium nitride layer was formed as the wetting layer to a thickness of about 300Å on the seed layer. Then, an aluminum layer was formed as a metal wiring layer to a thickness of about 5000Å. An X-ray diffraction pattern was observed on this sample and shown in FIG. 15. In FIG. 15, X-ray diffraction angles are set on an X axis in a range between 10–90°, and the intensity of measured diffraction peaks are set on a Y-axis.

In addition, in order to evaluate the properties of the metal wiring layer of the present invention by comparison, a sample was prepared according to a conventional metal wiring fabricating method. The sample in the conventional technology is the same as that of the present invention except that the seed layer was not introduced. Then, an X-ray diffraction pattern was observed on the metal wiring layer in the same manner as that for the sample of the present invention and shown in FIG. 16.

Figure 16:
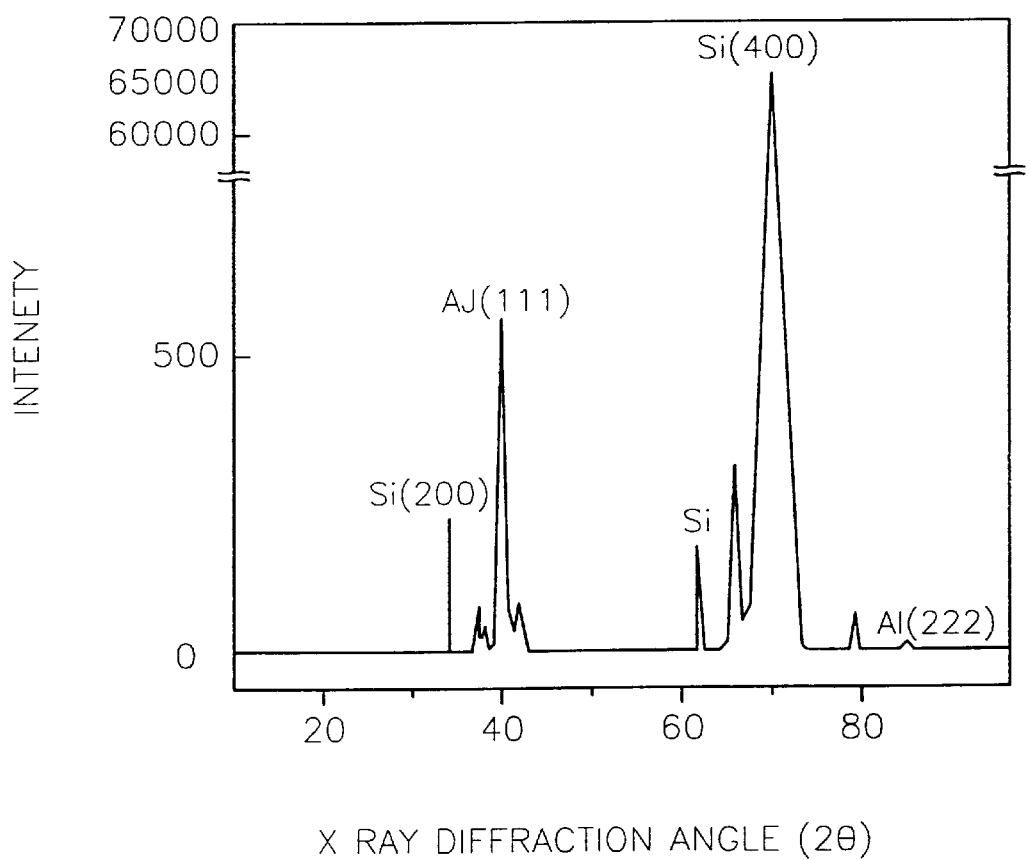
FIG. 16 is a graph showing an X-ray diffraction pattern observed in a metal wiring layer without the seed layer.

In comparing FIGS. 15 and 16, the (111) peak of the aluminum wiring layer is stronger in the presence of the seed layer than in the absence of the seed layer. That is, as shown in FIG. 15, the ratio of the intensity of the (111) peak of the aluminum layer to that of a (400) peak of silicon is about 0.3. On the other hand, as shown in FIG. 16, the ratio is very small, about 0.08, in the case without the seed layer.

Therefore, the intensity of the (111) X-ray diffraction peak of the aluminum layer in presence of the seed layer is about four times higher than that in absence of the seed layer.

This implies that the aluminum wiring layer with the seed layer introduced is grown to have a (111) preferred crystal orientation, relative to the conventional aluminum layer without the seed layer. That is, with the seed layer introduced, the titanium nitride layer (the wetting layer) is grown on the seed layer toward the (111) crystal orientation. Therefore, the aluminum layer is grown on the titanium nitride layer, preferentially in a crystal direction having a lattice parameter approximate to the lattice parameter 2.44Å of the (111) oriented titanium nitride layer, that is, to have a (111) preferred crystal orientation of a lattice parameter 2.338Å.

In addition, if the titanium layer is introduced as the wetting layer, the titanium layer has a (200) preferred crystal orientation of a lattice parameter 2.343Å approximate to the lattice parameter of the (111) oriented aluminum layer introduced as the seed layer. Thus, the aluminum wiring layer is grown on the titanium layer preferentially toward the (111) crystal orientation of a lattice parameter approximate to the lattice parameter 2.343Å of the (200) oriented titanium layer.

With the seed layer introduced, the aluminum wiring layer has a (111) preferred crystal orientation. The electromigration properties and thus the reliability of the aluminum wiring layer can be improved.

Example 3: Surface Morphology of Metal Wiring Layer

Figure 17:
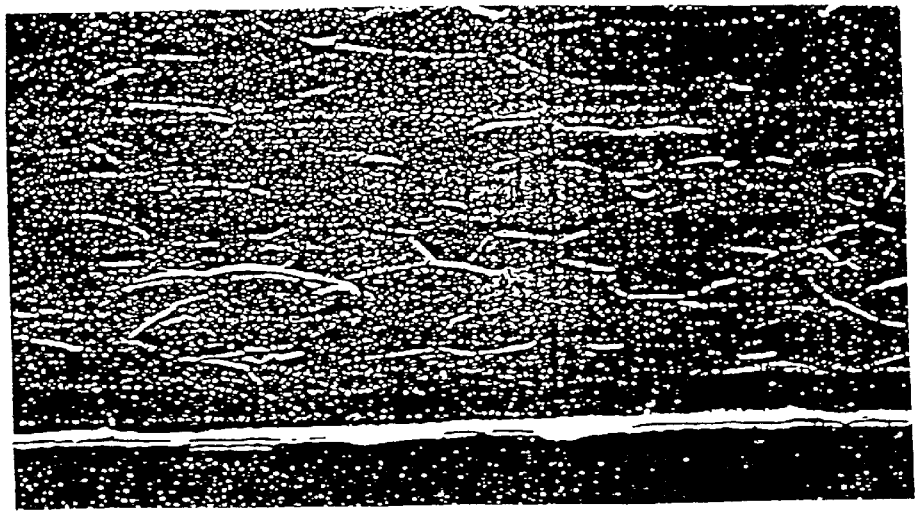
FIG. 17 is a Scanning Electron Microscope (SEM) picture showing the surface morphology of the metal wiring layer with the seed layer.
Figure 18:
FIG. 18 is an SEM picture showing the surface morphology of the metal wiring layer without the seed layer.

The surface morphologies of the metal wiring layers with the seed layer and without the seed layer, which are prepared as in the methods described referring to FIGS. 15 and 16, were observed, using a Scanning Electronic Microscope (SEM). The results are shown in FIGS. 17 and 18, respectively. By comparing FIGS. 17 and 18, better surface morphology is shown in the presence of the seed layer than in the absence of the seed layer. This result implies that the present invention, which includes a metal wiring layer formed on a seed layer, may be more favorable for a subsequent lithography step.

As described above, in metal wiring structure fabricating methods of the present invention, a metal wiring layer is grown in a predetermined crystal direction by forming a seed layer (preferably an aluminum layer), introducing a wetting layer on the seed layer, and then forming the metal wiring layer on the wetting layer. The metal wiring layer (preferably aluminum) can be grown in the (111) crystal orientation. Thus, the electromigration properties of the aluminum layer can be further improved, and can increase the reliability of the aluminum layer. In addition, since the aluminum wiring layer has a specific crystal orientation, the aluminum wiring layer can be more uniformly formed, and can thus have improved surface morphology.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A metal wiring structure for an integrated circuit comprising:

a seed layer on an integrated circuit substrate;

a wetting layer on the seed layer opposite the integrated circuit substrate; and a metal wiring layer on the wetting layer opposite the seed layer, wherein the seed layer and the metal wiring layer have the same crystal orientation;

wherein the integrated circuit includes an insulating layer thereon having a control hole therein, wherein the contact hole exposes an underlying portion of the integrated circuit substrate, and wherein the seed layer is on the insulating layer.

2. A metal wiring structure according to claim 1 wherein the wetting layer comprises a material different from that of the seed layer and the metal wiring layer.

3. A metal wiring structure according to claim 1 wherein the seed layer is an aluminum layer having (111) crystal orientation and wherein the metal wiring layer comprises aluminum having (111) crystal orientation.

4. A metal wiring structure according to claim 3 wherein the wetting layer comprises titanium.

5. A metal wiring structure according to claim 3 wherein the metal wiring layer comprises aluminum alloy having (111) crystal orientation.

6. A metal wiring structure according to claim 4 wherein the wetting layer is selected from the group consisting of a titanium layer, a titanium nitride layer and a composite layer of titanium and titanium nitride.

7. A metal wiring structure according to claim 1 further comprising a barrier layer between the underlying portion of the integrated circuit substrate and the seed layer in the contact hole.

8. A metal wiring structure for an integrated circuit comprising:

a first layer comprising aluminum on an integrated circuit substrate;

a second layer comprising titanium on the first layer opposite the integrated circuit substrate; and a third layer comprising aluminum on the second layer opposite the first layer, wherein the first layer and the third layer have the same crystal orientation;

wherein the integrated circuit includes an insulating layer thereon having a contact hole therein, wherein the contact hole exposes an underlying portion of the integrated circuit substrate, and wherein the first layer is on the insulating layer including on the underlying portion of the integrated circuit substrate in the contact hole.

9. A metal wiring structure according to claim 8 wherein the first layer is an aluminum layer having (111) crystal orientation and wherein the third layer comprises aluminum having (111) crystal orientation.

10. A metal wiring structure according to claim 8 wherein the third layer comprises aluminum alloy having (111) crystal orientation.

11. A metal wiring structure according to claim 8 wherein the second layer is selected from the group consisting of a titanium layer, a titanium nitride layer and a composite layer of titanium and titanium nitride.

12. A metal wiring structure according to claim 8 further comprising a barrier layer between the underlying portion of the integrated circuit substrate and the first layer in the contact hole.

13. A metal wiring structure for an integrated circuit comprising:

a conductive layer on an integrated circuit substrate;

an insulating layer on the conductive layer, the insulating layer having a contact hole that exposes an underlying portion of the conductive layer;

a seed layer on the insulating layer including on the underlying portion of the conductive layer in the contact hole;

a wetting layer on the seed layer opposite the insulating layer; and a metal wiring layer on the wetting layer opposite the seed layer, wherein the seed layer and the metal wiring layer have the same crystal orientation.

14. A metal wiring structure according to claim 13 wherein the wetting layer comprises a material different from that of the seed layer and the metal wiring layer.

15. A metal wiring structure according to claim 13 wherein the seed layer is an aluminum layer having (111) crystal orientation and wherein the metal wiring layer comprises aluminum having (111) crystal orientation.

16. A metal wiring structure according to claim 15 wherein the wetting layer comprises titanium.

17. A metal wiring structure according to claim 15 wherein the metal wiring layer comprises aluminum alloy having (111) crystal orientation.

18. A metal wiring structure according to claim 16 wherein the wetting layer is selected from the group consisting of a titanium layer, a titanium nitride layer and a composite layer of titanium and titanium nitride.

19. A metal wiring structure for an integrated circuit comprising:

a conductive layer on an integrated circuit substrate;

an insulating layer on the conductive layer, the insulating layer having a contact hole that exposes an underlying portion of the conductive layer;

a first layer comprising aluminum on the insulating layer including on the underlying portion of the conductive layer in the contact hole;

a second layer comprising titanium on the first layer opposite the insulating layer; and a third layer comprising aluminum on the second layer opposite the first layer, wherein the first layer and the third layer have the same crystal orientation.

20. A metal wiring structure according to claim 19 wherein the first layer is an aluminum layer having (111) crystal orientation and wherein the third layer comprises aluminum having (111) crystal orientation.

21. A metal wiring structure according to claim 19 wherein the third layer comprises aluminum alloy having (111) crystal orientation.

22. A metal wiring structure according to claim 19 wherein the second layer is selected from the group consisting of a titanium layer, a titanium nitride layer and a composite layer of titanium and titanium nitride.

* * * * *

UNITED STATES PATENT AND TRADEMARK OFFICE
CERTIFICATE OF CORRECTION

PATENT NO.    : 6,045,892
DATED         : April 4, 2000
INVENTOR(S)   : Lee et al.

It is certified that error appears in the above-identified patent and that said Letters Patent is hereby corrected as shown below:

Column 11, line 8, after "layer" please insert -- including on the underlying portion of the integrated circuit substrate in the contact hole -- .

Signed and Sealed this

Thirteenth Day of February, 2001

Attest:

NICHOLAS P. GODICI

Attesting Officer

Acting Director of the United States Patent and Trademark Office